US008273596B2

(12) United States Patent
Nagel et al.

(10) Patent No.: US 8,273,596 B2
(45) Date of Patent: Sep. 25, 2012

(54) METHOD FOR PRODUCING ELECTRIC CONTACTS ON A SEMICONDUCTOR COMPONENT

(75) Inventors: Henning Nagel, Untergruppenbach (DE); Wilfried Schmidt, Schwaigern (DE); Ingo Schwirtlich, Miltenberg (DE); Dieter Franke, BL Vaals (NL)

(73) Assignee: Schott Solar AG, Mainz (DE)

( * ) Notice: Subject to any disclaimer, the term of this patent is extended or adjusted under 35 U.S.C. 154(b) by 268 days.

(21) Appl. No.: 12/781,032

(22) Filed: May 17, 2010

(65) Prior Publication Data

US 2010/0297801 A1    Nov. 25, 2010

(30) Foreign Application Priority Data

May 19, 2009  (DE) .................... 10 2009 025 845
Sep. 1, 2009  (DE) .................... 10 2009 043 916

(51) Int. Cl.
*H01L 21/70*   (2006.01)
*H01L 31/18*   (2006.01)

(52) U.S. Cl. ......... 438/67; 438/83; 438/98; 257/E31.01

(58) Field of Classification Search .............. 438/57, 438/67, 83, 93–98, 107
See application file for complete search history.

(56) References Cited

U.S. PATENT DOCUMENTS

| 6,312,864 B1 | 11/2001 | Takai et al. |
| 6,433,620 B1 | 8/2002 | Mashiko et al. |
| 6,815,246 B2 * | 11/2004 | Gonsiorawski et al. ........ 438/57 |
| 6,884,649 B2 * | 4/2005 | Kobayashi et al. ............. 438/50 |
| 7,253,355 B2 * | 8/2007 | Schwirtlich et al. .......... 136/256 |

FOREIGN PATENT DOCUMENTS

| DE | 102006005026 | 8/2007 |
| EP | 1732138 | 12/2006 |
| JP | 2114210 | 4/1990 |
| WO | 9324934 | 12/1993 |
| WO | 2005088730 | 9/2005 |

* cited by examiner

*Primary Examiner* — Savitr Mulpuri
(74) *Attorney, Agent, or Firm* — Dennison, Schultz & MacDonald

(57) ABSTRACT

Process for producing strip-shaped and/or point-shaped electrically conducting contacts on a semiconductor component like a solar cell, includes the steps of applying a moist material forming the contacts in a desired striplike and/or pointlike arrangement on at least one exterior surface of the semiconductor component; drying the moist material by heating the semiconductor component to a temperature $T_1$ and keeping the semiconductor element at temperature $T_1$ over a time $t_1$; sintering the dried material by heating the semiconductor component to a temperature $T_2$ and keeping the semiconductor component at temperature $T_2$ over a time $t_2$; cooling the semiconductor component to a temperature $T_3$ that is equal or roughly equal to room temperature, and keeping the semiconductor component at temperature $T_3$ over a time $T_3$; cooling the semiconductor component to a temperature $T_4$ with $T_4 \leq -35°$ C. and keeping the semiconductor component at temperature $T_4$ over a time $T_4$; and heating the semiconductor component to room temperature.

13 Claims, 1 Drawing Sheet

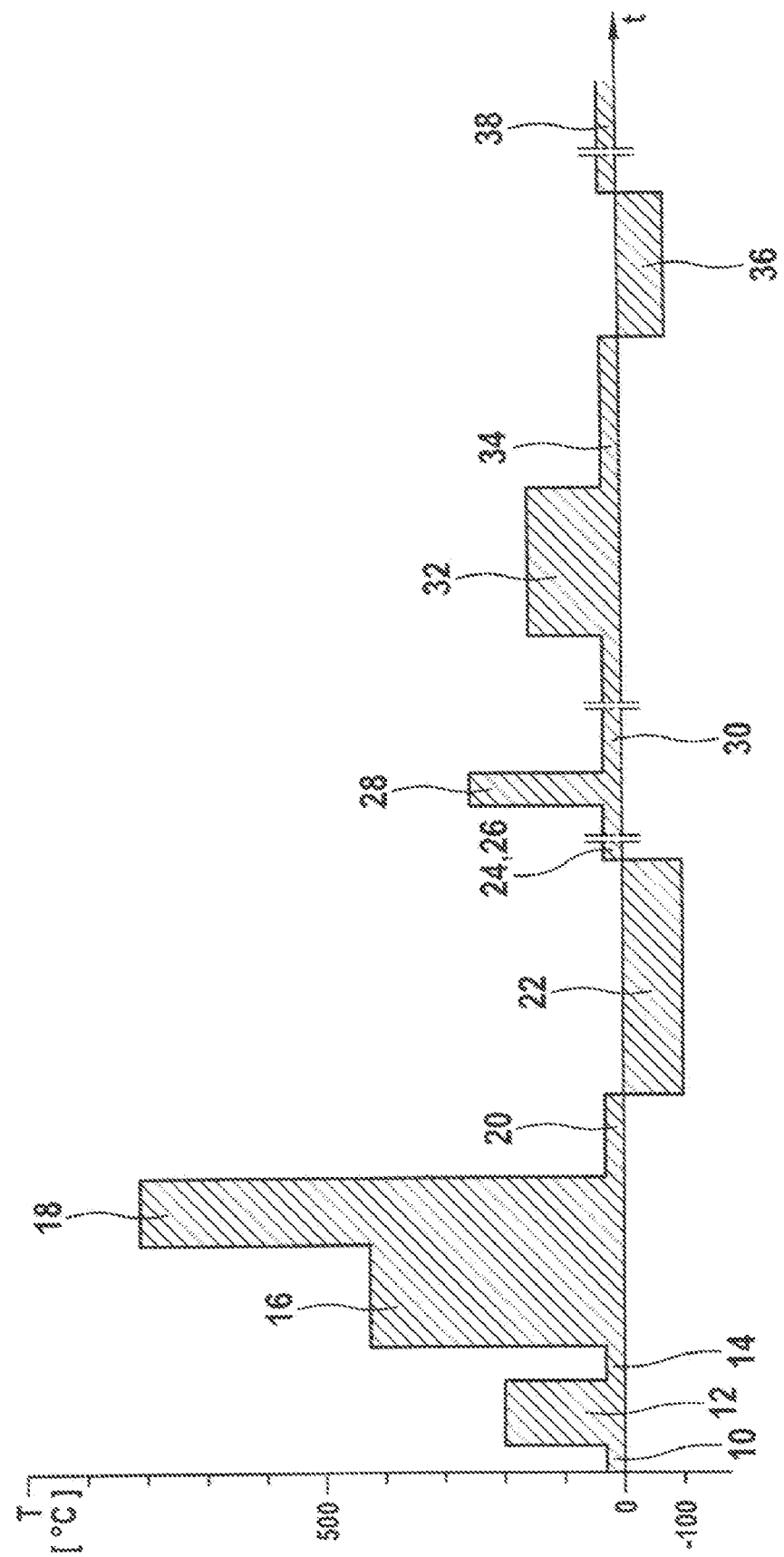

METHOD FOR PRODUCING ELECTRIC CONTACTS ON A SEMICONDUCTOR COMPONENT

BACKGROUND OF THE INVENTION

The invention relates to a method for improved manufacture of strip-shaped and/or point-shaped electrically conducting contacts on a semiconductor element such as a solar cell. The invention also makes reference to a method for manufacturing a composite of semiconductor elements, such as a solar module.

When manufacturing electronic components, fine electrically conducting structures are applied primarily by means of physical and chemical gas-phase deposition, galvanic processes using masks or possible with additional laser support. These techniques permit manufacture of very fine structures, even though, for economic reasons, they are hardly suitable for cost-effective mass production.

With manufacture of solar cells, in regard to the side that is faced toward the irradiation, a requirement exists to apply electrically conducting structures that are as fine as possible, which ensure good electrical conductivity as well as good electrical contact to the solar cell. This is required because the surface facing toward the irradiation is to be in shadow as little as possible.

However, to make possible good electrical conductivity with high current dissipation, the conductor in question must have a large cross section.

To meet these requirements, according to the prior art, contacts are often applied via screen printing, which can be amplified by galvanic processes.

According to WO-A-91/24934, an electrically conducting paste can be applied onto a carrier, which is polymerized and stabilized by irradiation with UV light.

To form a structure on a plasma screen, according to U.S. Pat. No. 6,312,864 it is known to apply a substance with a binder to be decomposed by heat, which then can is cured by thermal action. U.S. Pat. No. 6,433,620 proposes curing of a substance on a carrier by thermal treatment.

A paste is known from JP-A-63268773 that is free of solvents and contains a precious metal powder, fritted glass, metal oxide and a binder.

When the pasty substances are applied to form electrically conducting contacts, pressure-application procedures can be used. However, fundamentally these display a disadvantage in that if the line is narrow, it is not possible for the layer to have great thickness. This results in the disadvantage that wider lines, or a greater number of them, are required to attain the desired low contact resistance values.

From WO-A-2005/088730, a procedure is known for forming a linear and/or a point-shaped structure on a solar cell, in which an electrically conducting pasty substance adhering on the carrier is applied which contains a solvent. To avoid a dissolution of the strip-shaped material after application, and to have the strips pull together in width terms after application, it is proposed that following application of the pasty material, a medium is applied to it that contains polar molecules and that the solvent is extracted at least in part.

The medium containing the polar molecules is especially a surfactant medium in the form of a liquid or a foam.

To avoid solar cells having a flat rear contact that can consist of aluminum, being bent through during the manufacturing process, according to DE-B-10 2005 026 176 it is proposed that after the flat rear contact is applied, the solar cell be heated to a temperature above 567° C. then be cooled to below the manufacturing ambient temperature of the solar cell. Preferred temperature ranges lie between 0° C. and −40° C.

Proper solar cells usually are interconnected to modules in which the solar cells are embedded in plastic layers, preferably made of ethylene vinyl acetate (EVA). On its front side, the module preferably is covered by a pane of glass or some other transparent plate, and on the rear side by a plastic composite foil, for example.

Moisture penetrating into the module, high temperatures and UV irradiation can result in acetic acid forming when EVA is used, which can form acetates with the contacts and the metals present in the glass, thus causing the contacts to corrode.

In DE-A-10 2006 005 026, a procedure is described for manufacturing flat transparent metal oxide surfaces. For this, an electrically conducting metal oxide and a dispersing agent in the form of a layer are applied onto a substrate, and then sintered by microwave irradiation. Between the application and the sintering, a drying step may be carried out.

SUMMARY OF THE INVENTION

The object of the invention is to further develop the method of the type named initially, so that the locally applied contacts, like the front contacts and/or, depending on the design of the semiconductor element, also contacts present locally on the rear side, have high corrosion resistance to acidic media, especially organic acids like acetic acid, formic acid, citric acid, oxalic acid, and also to inorganic acids such as HCl, carbon dioxide and other corrosive components like soldering auxiliary agents that have organic polar solvents, as well as generally to generally to proton-releasing media.

According to a further object, improved corrosion resistance is achieved to alkaline media such as diluted inorganic or organic alkalis, as well as mixtures of them with other compounds that lead to a pH value>7, in the basic range.

According to another object of the invention, the efficiency of proper semiconductor components, especially solar cells, should be improved in compared to those manufactured according to the known procedures.

To achieve these and other objects, the invention provides a process for manufacturing strip-shaped and/or point-shaped electrically conducting contacts on a semiconductor component like a solar cell, which comprises the steps of:

(a) Application of a moist material forming the contacts in the desired striplike and/or point-like arrangement on at least one exterior surface of the semiconductor component;

(b) Drying of the moist material by heating the semiconductor component to a temperature $T_1$ and keeping the semiconductor element at temperature $T_1$ over a time $t_1$;

(c) Sintering of the dried material by heating the semiconductor component to a temperature $T_2$ and keeping the semiconductor component at temperature $T_2$ over a time $t_2$;

(d) Cooling the semiconductor component to a temperature $T_3$ that is equal or roughly equal to room temperature, and keeping the semiconductor component at temperature $T_3$ over a time $t_3$;

(e) Cooling the semiconductor component to a temperature $T_4$ with $T_4 \leq -35°$ C. and keeping the semiconductor component at temperature T4 over a time $t_4$;

(f) Heating the semiconductor component to room temperature.

A procedure for manufacturing a composite of semiconductor components that have strip-shaped and/or point-shaped electrically conducting contacts on at least one side, especially for interconnecting solar cells in a module, in essence comprises the following procedural steps for solving the problem that is the basis of the invention or for parts of the problem:

(I) Joining the semiconductor components with each other by heating the semiconductor components at least in the area of the contacts to a temperature $T_I$ with 120° C.$\leq T_1 \leq$370° C. and keeping it over a time $t_I$;

(II) Encapsulating the semiconductor components at a temperature $T_{II}$, and keeping them over a time $t_{II}$;

(III) Adjusting the encapsulated semiconductor component to a temperature $T_{III}$ with 20° C.$\leq T_{III} \leq$90° C. and keeping it over a time $t_{III}$, with the encapsulated semiconductor components subjected to a corrosive environment;

(IV) Cooling of the encapsulated semiconductor components to a temperature $T_{IV}$ with 20° C.$\leq T_{IV} \leq$40° C. and keeping the encapsulated semiconductor components over a time $t_{IV}$;

(V) Heating the encapsulated semiconductor components to, or keeping them at, room temperature.

According to the invention, the semiconductor component, which can in a first embodiment example be a solar cell made of crystalline silicon, is subject to a temperature progression or sequence with at least four temperature holding points, that includes drying at a temperature $T_1$ for a time $t_1$, sintering at a temperature $T_2$ for a time $t_2$, cooling to room temperature and cooling to a temperature $T_4 \leq$ −35° C. for a time $t_4$, as long as one does not make allowance for heating from room temperature to the temperature at which the drying process is carried out, and heating from temperature $T_4$ to room temperature.

In addition, according to the invention, a semiconductor component or the semiconductor component manufactured according to the procedure explained previously, is interconnected to a composite like a solar cell composite and/or a solar module, with the semiconductor component, which according to its function, is able to be present in a completed structure and/or in intermediate states of various manufacturing steps, being subjected to a temperature progression or sequence over the desired times, which include heating to a temperature $T_I$ and keeping preferably over a time of 0.1 seconds$\leq t_I \leq$15 seconds, cooling to room temperature ($\approx$20° C.) and subsequent laminating or encapsulating of the interconnected semiconductor components like solar cells at a temperature $T_{II}$ of 130° C.$\leq T_{II} \leq$160° C. over a time $t_{II}$ of 1000 seconds$\leq t_{II}$1800 seconds, cooling to room temperature ($\approx$20° C.) and subsequent heating of the interconnected semiconductor components to temperature $T_{III}$ with 20° C.$\leq T_{III} \leq$90° C. and keeping at this temperature $T_{III}$ over a time $t_{III}$ with 1 second$\leq t_{III} \leq$600 seconds and cooling to the temperature $T_{IV}$ while keeping it over a time $t_{IV}$ with a 1 seconds$\leq t_{IV} \leq$600 seconds.

According to the invention, the corresponding temperature-time progressions or sequences can also be repeated with the semiconductor component or components being able to be placed in a climate-controlled chamber, to attain a surprisingly positive effect on the electrical contacts and functionality of the overall semiconductor component. Especially a selection is to be made of the temperature and time of the individual procedural steps depending on a material constant K or K*, which lies between 0.02 J per cm$^{2\circ}$ C. and 0.06 J per cm$^{2\circ}$ C. with procedural steps (a) to (f) and between 0.05 J per cm$^{2\circ}$ C. and 1.5 J per cm$^{2\circ}$ C. with procedural steps (III) and (IV).

Characteristic of the invention-specific procedure or the thermal treatment of the semiconductor component or of the composite of semiconductor components is the adjustment of time duration and temperature that have an effect on the semiconductor component or the composite. The semiconductor component or the composite of semiconductor components is subjected over a time Δt to a temperature ΔT, to attain a thermal or energy content that corresponds to the product P=K·ΔT·Δt, or P*=K*·ΔT·Δt.

Consequently the temperature-time relationship, and thus the intensity of treatment is of the essence for the invention.

ΔT is the temperature difference in the particular procedural step from 0° C.

The corresponding material constants are derived from the following formula:

$$K = A \times d \times \rho \times Cp \times B$$

where:
A=surface of the semiconductor component in cm$^2$.
d=thickness of the semiconductor component in cm.
$\rho$=density of the semiconductor component in g per cm$^3$
Cp=thermal capacity of the semiconductor component [J/gK]
B=reference size to [1/cm$^2$] of the particular semiconductor component to be treated The material constant K* is derived from:

$$K^* = A^* \times d^* \times \rho^* \times Cp^* \times B^*$$

where:
A*=surface of the interconnected semiconductor component in cm$^2$.
d*=thickness of the interconnected semiconductor component in cm.
$\rho$*=density of the interconnected semiconductor component in g per cm$^3$
Cp*=thermal capacity of the interconnected semiconductor component [J/gK]
B*=reference size to [1/cm$^2$] of the interconnected semiconductor component like a solar module.

It has been shown that the thermal treatment steps and the maintenance of certain temperature-time-material constants ensure reliable adherence of the material forming the electrically conducting contacts to the semiconductor component, which also precludes detachment even in a corrosive environment.

In surprising fashion, the efficiency is even increased, if, after stabilization of the contacts, they are subjected to a corrosive atmosphere, as this may for example be the case in a solar module, which, resulting from the materials it employs, leads to a corrosive environment for the solar cells or solar cell composites used.

Effects that act positively both for the function and the service life of solar cells and solar modules were observed with the invention-specific temperature or temperature-time-material constants treatment, allowing for the thermal content P or $\rho$*, both of solar cells and also of solar modules in various stages of manufacture.

Therefore, provision is made in a further development of the invention-specific teaching that during the manufacturing process, a corrosive atmosphere, such as a surfactant, moist, oxidative, or alkaline one, can be generated, that acts on the semiconductor component. We can refrain from generating a corrosive atmosphere if, for example, the semiconductor components like the solar cells are interconnected to a module and are encapsulated in a material that provides a corrosive atmosphere.

For the invention-specific procedure, the especially advantageous following temperature-time-material constants result, as well as products calculated therefrom:

| | Temperature [° C.] | Time [s] | Material Constant [J/cm$^2$ ° C.] | Product ($P = K \cdot \Delta T \cdot \Delta t$ or $P = K^* \cdot \Delta T \cdot \Delta t$) [J s/cm$^2$] |
|---|---|---|---|---|
| Step (b) Drying | $T_{Min} = 100°$ C. $T_{Max} = 300°$ C. | $t_{Min} = 1$ sec. $t_{Max} = 600$ sec. | $K_{Min} = 0.02$ $K_{Max} = 0.06$ | $P_{Min} = 2$ $P_{Max} = 10800$ |
| Step (i) Pre-Sintering | $T_{Min} = 350°$ C. $T_{Max} = 480°$ C. | $t_{Min} = 1$ sec. $t_{Max} = 120$ sec. | $K_{Min} = 0.02$ $K_{Max} = 0.06$ | $P_{Min} = 7$ $P_{Max} = 3456$ |
| Step (c) Sintering | $T_{Min} = 720°$ C. $T_{Max} = 920°$ C. | $t_{Min} = 1$ sec. $t_{Max} = 120$ sec. | $K_{Min} = 0.02$ $K_{Max} = 0.06$ | $P_{Min} = 14.4$ $P_{Max} = 6624$ |
| Step (d) Storage | $T_{Min} = 20°$ C. $T_{Max} = 40°$ C. | $t_{Min} = 1$ sec. $t_{Max} = 24$ hours | $K_{Min} = 0.02$ $K_{Max} = 0.06$ | $P_{Min} = 0.4$ $P_{Max} = 207360$ |
| Step (e) Cooling | $T_{Min} = -35°$ C. $T_{Max} = -200°$ C. | $t_{Min} = 1$ sec. $t_{Max} = 4$ hours | $K_{Min} = 0.02$ $K_{Max} = 0.06$ | $P_{Min} = -0.7$ $P_{Max} = -172800$ |
| Step (I) Soldering | $T_{Min} = 120°$ C. $T_{Max} = 370°$ C. | $t_{Min} = 0.1$ sec. $t_{Max} = 15$ sec. | $K_{Min} = 0.02$ $K_{Max} = 0.06$ | $P_{Min} = 0.24$ $P_{Max} = 333$ |
| Step (II) Encapsulating | $T_{Min} = 130°$ C. $T_{Max} = 160°$ C. | $t_{Min} = 1000$ sec. $t_{Max} = 1800$ sec. | $K^*_{Min} = 0.9$ $K^*_{Max} = 1.6$ | $P^*_{Min} = 117000$ $P^*_{Max} = 460800$ |
| Step (III) Cooling | $T_{Min} = 20°$ C. $T_{Max} = 90°$ C. | $t_{Min} = 1$ sec. $t_{Max} = 600$ sec. | $K^*_{Min} = 0.5$ $K^*_{Max} = 1.5$ | $P^*_{Min} = 10$ $P^*_{Max} = 81000$ |
| Step (IV) Cooling | $T_{Min} = -40°$ C. $T_{Max} = 20°$ C. | $t_{Min} = 1$ sec. $t_{Max} = 600$ sec. | $K^*_{Min} = 0.5$ $K^*_{Max} = 1.5$ | $P^*_{Min} = -20$ $P^*_{Max} = 18000$ |

The calculation of the material constants is derived according to the formulae previously reproduced.

Preferred values for the input of heat or energy P of the individual procedural steps are to be given as follows:

For procedural step (a): 0.4 J s/cm$^2 \leq P \leq 720$ J s/cm$^2$.
For procedural step (b): 2 J s/cm$^2 \leq P \leq 10800$ J s/cm$^2$.
For procedural step (c): 288 J s/cm$^2 \leq P \leq 4416$ J s/cm$^2$.
For procedural step (d): 0.4 J s/cm$^2 \leq P \leq 1440$ J s/cm$^2$.
For procedural step (e): $-1.2$ J s/cm$^2 \leq P \leq 86400$ J s/cm$^2$.
For procedural step (i): 7 J s/cm$^2 \leq P \leq 3456$ J s/cm$^2$.
For procedural step (l): 0.24 J s/cm$^2 \leq P \leq 333$ J s/cm$^2$.
For procedural step (m): 117000 J s/cm$^2 \leq P \leq 460800$ J s/cm$^2$.
For procedural step (n): 117000 J s/cm$^2 \leq P \leq 460800$ J s/cm$^2$.
For procedural step (I): 0.24 J s/cm$^2 \leq P^* \leq 333$ J s/cm$^2$.
For procedural step (II): 117000 J s/cm$^2 \leq P^* \leq 460800$ J s/cm$^2$.
For procedural step (III): 10 J s/cm$^2 \leq P^* \leq 81000$ J s/cm$^2$.
For procedural step (IV): $-20$ J s/cm$^2 \leq P^* \leq 18000$ J s/cm$^2$.

Preferably, after the strip-shaped or point-shaped application of the moist material, that especially contains a pasty substance that, along with solvents, contains metals like aluminum, silver, copper, chromium, vanadium, palladium, titanium, molybdenum as well as glasses that preferably contain metal oxides, semimetals, boron, phosphorus, as well as ceramics like $SiO_2$, boron oxide, phosphorus oxide, $Al_2O_3$, $Al_xO_y$, SiC, $Si_3N_x$ as well as carbon of various morphology like soot, graphite, nanotubes, and fullerine, the semiconductor component like the solar cell is kept over a time $t_a$ at room temperature.

During this maintenance, the semiconductor component should be subjected to moist air with a moisture content U of preferably 20% relative humidity $\leq U \leq 80$% relative humidity.

The moisture content is the ratio of the moisture contained in the material to the weight of the moisture-free material.

The pasty material is preferably applied by printing, dispensing or ink-jet application.

During the maintenance over the time $t_a$, which may be between 1 second and 600 seconds, provision is especially to be made that the moist material is put in contact with a base medium or a medium containing a base component. In particular, a surfactant medium is used as the base medium, with water being able to be used as a surfactant medium and anionic surfactants like soap, fatty alcohol sulfates, alkyl benzolsulfonates and/or cationic surfactants like invert soap and/or amphoteric surfactants and/or non-ionic surfactants like non-carboxylic acid esters of polyalcohols.

Especially the surfactant medium is applied in the form of a liquid or a foam in the area of the applied moist material onto the semiconductor component.

Then the drying step is carried out, with the semiconductor component being heated to a temperature $T_1$ between 100° C. and 300° C. At the selected final temperature, which preferably is around 200° C., the semiconductor element is preferably kept over a time between 1 second and 600 seconds. During the heating and the maintenance period, or at least during the maintenance period, the semiconductor component should be subjected to an oxidizing atmosphere that may consist of a mixture of air and solvent and/or water vapor and/or reaction products of them.

In other words, a green compact is produced during the drying process.

Then the semiconductor component can be cooled in air, preferably to room temperature, even if it can only be cooled to a somewhat higher temperature up to 80° C.

In a subsequent step, heating takes place to a temperature between 350° C. and 480° C., to expel the remaining organic components from the material that forms the electrically conducting contacts. In this step, the semiconductor component should be in an oxidizing atmosphere. This can consist of air, if necessary with an enhanced oxygen content or of a mixture of air, binder, resin and residues of solvents as well as their cleavage products and reaction products (with each other and among each other). The step in regard to this can also be tantamount to a pre-sintering. The dwell times correspond to the holding step.

In the following sintering step, the semiconductor component is heated to 820° C. ± 100° C., and kept at this temperature $T_2$ in an oxidizing atmosphere over a time between 1 second and 120 seconds. Particularly, air with an increased oxygen or water content is designated as the oxidizing atmosphere.

With the sintering, first the metal portion is melted to the contact surface, while in contrast the superficial areas can only be melted on to ensure the required connection between the individual particles. Naturally, the particles of the dried moist material can be fully melted through or only superficially melted, without departing from the invention. Further reactions and following amplification steps can be run through, as are, for example, described by D. Pysch et al. in "Comprehensive analysis of advanced solar cell contacts consisting of printed fine-line seed layers thickened by silver plating," in Progress in Photovoltaics: Research and Applications 17: 101-114, incorporated herein by reference, without departing from the invention.

Preferably the sintering step is controlled so that the strip-shaped and/or point-shaped material is applied in layers so that at least an open-pored outer layer is present, with the volume share of the pores being between 10% by volume and 40% by volume, preferably 25% by volume. Additionally, the layers should be applied so that the inner layers are thicker than the outer layers.

Owing to the open-pored nature of the outer layer, an advantage arises in that alkaline media or alkaline components can be stored, those being, for example, alkaline salts like alkaline or alkaline earth carbonates. This has an advantage in that when the semiconductor components during operation are subjected to a concentrated corrosive atmosphere, a neutralization occurs to an extent that the contacts are prevented from being damaged.

The layers present according to the sintering process should be between 1/10 µm and 20 µm thick, with the overall height of the contact consisting of the layers being up to 40 µm, to ensure the desired low electrical resistance to diversion of charge carriers.

Additionally, after the sintering step and cooling to room temperature, or after the cooling step and heating to room temperature, an option exists to cover the electrically conducting contact at least in sections with a metal layer that is, for example, galvanically applied.

The contact should be sintered in an oxidizing atmosphere, with especially air forming the atmosphere, with an increased oxygen content if necessary.

Then the semiconductor component is cooled to room temperature ($T_3$). After cooling to room temperature, when the semiconductor components like solar cells are to be processed in a run-through process, they can be kept over a period between 1 second and 24 hours.

If the semiconductor components like solar cells are batch-processed, the semiconductor component manufactured according to the invention can be kept for up to several hours, such as up to 5 hours or even 24 hours in a storage step, at a defined atmosphere with reduced humidity.

Then the cooling step follows to a temperature $T_4$ below −35° C., especially to a temperature in the range between −35° C. and −200° C. The semiconductor component is kept at the desired temperature, and especially cooled and kept, in an inert atmosphere. If an inert atmosphere is chosen, it should consist of nitrogen or argon or a mixture of these.

In addition, the environment of the semiconductor component cooled to the low temperature should contain an alcohol like methanol and ethanol or dry ice or moisture-absorbing salts, to bind the moisture. The holding times $t_4$ at temperature $T_4$ are 1 second $\leq t_4 \leq$ 14400 seconds. After the semiconductor component has gone through the cooling step, it is heated to room temperature, likewise preferably in an inert atmosphere or with dried air. In the environment, dry ice or alcohol like methanol or ethanol can be present.

After heating to room temperature the semiconductor component can be kept at this temperature for 1 second to 24 hours or longer, with the semiconductor component being subjected to a moist, basic or acidic atmosphere. The atmosphere can contain water and/or $CO_2$ and/or acetic acid.

Then, in the areas in which the strip-shaped or point-shaped electrically conducting contacts are to be connected with electrically conducting connectors, the semiconductor components are heated to a temperature in the range between 120° C. and 370° C. During this time, the semiconductor component is exposed to air.

After connecting such as soldering, the semiconductor component is encapsulated at temperatures of 130° C.$\leq T_H \leq$160° C., in order, especially with solar cells, to produce a module. Likewise before or during the encapsulation, alkaline components can be added that attach to or penetrate the contacts, to make possible at least a partial neutralization of an acidic atmosphere which can occur if semiconductor components are embedded in ethylene vinyl acetate (EVA), which forms acetic acid in the presence of UV light, heat and/or moisture.

According to an independent aspect of the invention, after the interconnected semiconductor component like a solar module is subject in various intermediate steps of its manufacture to a combination of temperature-time-material constant progressions, the embedding material also, which is used to construct the module, can serve to generate a corrosive as well as chemically inhibiting environment for the employed semiconductor components like solar cells.

By the previously described sequence of steps of temperature and time or material constant, the contacts are stabilized so that a corrosive environment of solar cells as the semiconductor components, with proper use of solar cells in solar modules, normally at least 20 years in outside weather conditions in various climatic zones, will not result in the contacts of the solar cells becoming loose or seriously damaged. Additionally, in surprising fashion, the efficiency of the solar cells can be increased without the contacts becoming loose from the semiconductor component.

BRIEF DESCRIPTION OF THE DRAWING

Further particulars, advantages and features of the invention are derived not merely from the claims, and the features to be drawn from them—separately or in combination, but also from the following description of an example.

The invention-specific teaching is explained in what follows in greater detail using an embodiment example, with procedural steps being reconstructed principally with reference to the sole drawing FIGURE, which is a graph of temperature vs. time, showing the temperature that is used with the individual procedural steps without taking ramps into account. The time is applied with no specific indication of values, to make possible a depiction in principle of the procedural sequence.

DESCRIPTION OF THE PREFERRED EMBODIMENTS

The following invention-specific teaching is explained using a solar cell as a semiconductor component, without having a limitation thereby.

Thus, for example, in a substrate consisting of crystalline p-silicon, by diffusing P atoms in, an n-conducting emitter layer can be configured, to form a p-n transition in the substrate.

Then, onto the rear side of the substrate, preferably a flat layer is applied consisting of aluminum or containing aluminum, that forms the rear contact when the solar cell is finished. On the front side, for manufacture of the front contact by means of dispensation or ink-jet deposition procedures, for example, a solvent-containing paste is applied in a strip shape (procedural step (a). Along with the solvent, the paste can contain metals like aluminum, silver, copper, chromium, vanadium, palladium, titanium, molybdenum as well as glasses that preferably contain metal oxides, semimetals, boron, phosphorus, as well as ceramics like $SiO_2$, boron oxide, phosphorus oxide, $Al_2O_3$, $Al_xO_y$, SiC, $Si_3N_x$ as well as carbon with various morphology. After applying the strips forming the front contacts, a foam containing surfactant is applied, through which solvents are extracted from the applied material and at least the surface layer is cured, with the result that the strip is prevented from melting.

The foam can be applied during a holding step at room temperature (area 10 in the FIGURE), with an atmosphere simultaneously being used with a moisture content U preferably of U>50%. Then the foam is removed and a drying step is carried out at a temperature of about 200° C. in an oxidizing atmosphere (procedural step (b)=12). At the desired temperature, the solar cell is maintained between 1 second and 600 seconds. Then it again is cooled (procedural step (g)=14), in order then, at a temperature of up to about 415° C., to expel the residual organic components from the previously pasty material (procedural step (i)=16). This procedural step is conducted in an oxidizing atmosphere. Then the dried material is sintered (procedural step (c)=18), and in fact at a temperature of about 800° C. At this temperature, the solar cell is kept for a period between 20 seconds and 80 seconds in an oxidizing atmosphere.

The solar cell is then cooled to room temperature ($\approx 20°$ C.) (procedural step (d)=20) and can be kept at room temperature over a period between 1 second and 600 seconds in an air atmosphere, if it is process in a run-through procedure. If using batchwise operations, then a storage step can follow, in which the solar cell is stored up to several hours in a defined atmosphere with reduced humidity.

Then the solar cell is cooled to a temperature below −35° C., preferably in a range between −60° C. and −100° C. (procedural step (e)=22), with an inert or dry air being selected as the atmosphere. At the low temperature, the solar cell is then kept for between 1 second and 4 hours. Additionally, alcohol or dry ice may be present, to bind moisture. After the cooling step, the solar cell is heated to room temperature, preferably in air, with also a moist or even corrosive atmosphere able to prevail. After heating to room temperature, the solar cell is stored at that temperature or the ambient temperature as needed (procedural step (f)=24).

In one embodiment version, during storage, the electrically conducting contacts are provided with alkaline salts like alkali or alkaline earth carbonates, which then cause a required neutralization if the contacts are to be subjected to a concentrated acidic atmosphere. The alkaline components can also be inserted into the contacts, if an open-pored outer layer is generated during the sintering process.

After the solar cells are stored for 24 hours in an water-vapor-saturated environment (procedural step (k)=26), which also can contain $CO_2$ and/or acetic acid, in surprising fashion it has been shown that the contacts adhere with sufficient stability to the silicon disk, while if the prerequisites described above are not adhered to, the contacts with an adhesive film can be detached from the wafer. It has especially been shown that especially the local Ag-containing contacts can withstand an attack by weak acetic acid in a 5- to 10-times concentration with no impairments in adhesive stability as compared to those in which the contacts manufactured according to the prior art can get loose in part with the adhesive film.

In one variation on the embodiment example, during storage after heating to room temperature, the solar cell can be stored in an alkaline solution with a pH from 7 to 13, and preferably about 9 to 11. Even thereafter, it was found that contact adhesion was maintained during a loosening test with the adhesive film, after storage times up to 10 times longer, which in contacts manufactured according to prior art led in part to dissolutions with the applied adhesive film.

In both versions of the embodiment example, for storage in a corrosive acidic or alkaline environment, efficiency improvements customarily could be measured of 1 to 2% relatively, and in individual instances above 5% relatively.

In a further configuration of the embodiment example, the solar cell—after cooling to about −160° C. with a holding time of 60 minutes, subsequent heating to room temperature and storage in air for 3 days at the ambient temperature—in a further step, at least in those areas in which an electrically conducting connection is to be made with the connectors, for example by soldering or adhesive bonding to obtain a solar cell composite, is heated to a temperature in the area between 120° C. and 370° C. in air (procedural step (l) or (I)=28), so that again, after the connection, the solar cell or the solar cell composite is cooled to room temperature (procedural step (m) or (II)=30), to be interconnected with additional appropriately manufactured solar cells via connectors, and then to be encapsulated in a reduced-pressure atmosphere at a temperature in a range between 130° C. and 160° C. (procedural step (n) or (II)=32). The interconnected solar cells are embedded, for example, in ethylene vinyl acetate (EVA), and covered on the front side with a glass plate and on the rear side with a plastic composite foil or another glass plate.

After subsequent storage for about 1 month in a moist environment at an elevated temperature up to 80° C., partially combined with irradiation by ultraviolet light, it was determined that owing to the described thermal treatment steps, the solar cells manufactured according to the invention within the solar module, after the storage was ended, showed roughly 2%-3% higher efficiency compared to the traditionally manufactured solar cells. This relative advantage was also maintained even after further storage with a duration of several months under the conditions described previously.

With other paste compositions also, while varying the morphology of the metal particles, the fritted glass composition and/or the organic components, similar observations were made. For example, the solids content (metal and frit) was varied in a range of 30-90%, and the share of metal in the overall solids content was varied in a range of 90-100%. In addition, different solvents and also binding resins were varied as the usual organic components.

Then the encapsulated solar cells, interconnected into a module, are cooled to a temperature between 20° C. and 90° C. (procedural step III=34) and kept over a time preferably between 1 second and 600 seconds. This is followed by a further cooling process (procedural step IV=36) in which the module is kept over a period between 1 second and 600 seconds in a temperature range between +20° C. and −40° C. Then the solar cells are heated to room temperature (procedural step (V)=38), to then store the module over a desired duration at this temperature.

The surfaces depicted as shaded in the FIGURE correspond to the product P, and thus to the thermal or energy content of the solar cells or of the module, based on the temperature T acting over time t.

In another embodiment example, initially a thin ink or paste layer, only about 0.1 μm-3 μm thick, is applied locally using an ink-jet or transfer process onto one or both sides of the silicon substrate. This may occur at room temperature or at an elevated temperature up to 200° C., to obtain a drying already in situ. Following a cooling done for sequential reasons, the residual organic components are expelled usually at about 400° C.-550° C. from the previously inky or pasty material in an oxidizing atmosphere. Then the sintering step is done at a temperature of about 850° C. for about 20 seconds to 80 seconds in an oxidizing atmosphere. The solar cell is then cooled to room temperature.

Then, in a galvanic process, the thin contact layer manufactured thus is galvanically reinforced by precipitation of metals like silver, nickel, or copper, until the desired conductivity of the overall contact is achieved.

In an alternative to this embodiment example, after drying or after sintering, an additional pasty layer is applied onto the locally applied thin layer, by screen printing, transfer printing or dispensing, and then is likewise subjected to the temperature steps previously described.

As an alternative, polymer-based metal pastes can also be applied onto the sintered first contact layer in the thickness required for sufficient conductivity, and cured at 100° C. to 400° C., or under ultraviolet light.

In a further variation on this embodiment example, with a solar cell having rear side contacts, both types of contacts are applied on the back side of the silicon substrate in the form of comb-like contact arrangements, the so-called interdigitated contact design, by the sequences described previously.

With all these embodiment versions, the temperature-time-sequences and storage variations described previously are carried out. By this means also, comparable results regarding improvement of contact adhesion and efficiency through the effect of acidic or alkaline media are achieved.

What is achieved through the thermal treatment steps and their specific temperature-time-material constant products and their sequence (see the table, for example), is that the electrically conducting front contacts exhibit a corrosion resistance that is improved in comparison to previously known contacts vis-à-vis acidic media. Also, in surprising fashion, it has been shown that a corrosive environment results in the efficiency being improved.

What is claimed is:

1. Process for producing strip-shaped and/or point-shaped electrically conducting contacts on a semiconductor component like a solar cell, comprising the steps of:
    (a) applying a moist material forming the contacts in a desired striplike and/or point-like arrangement on at least one exterior surface of the semiconductor component;
    (b) drying the moist material by heating the semiconductor component to a temperature $T_1$ and keeping the semiconductor element at temperature $T_1$ over a time $t_1$;
    (c) sintering the dried material by heating the semiconductor component to a temperature $T_2$ and keeping the semiconductor component at temperature $T_2$ over a time $t_2$;
    (d) cooling the semiconductor component to a temperature $T_3$ that is equal or roughly equal to room temperature, and keeping the semiconductor component at temperature $T_3$ over a time T3;
    (e) cooling the semiconductor component to a temperature $T_4$ with $T_4 \leq -35°$ C. and keeping the semiconductor component at temperature $T_4$ over a time T4; and
    (f) heating the semiconductor component to room temperature.

2. Process according to claim 1, wherein after the application of the moist material (procedural step (a)) at room temperature, the semiconductor component is kept over a time $t_a$, with the semiconductor component preferably exposed during time $t_a$ to moist air with a moisture content U preferably of 20% relative humidity $\leq U \leq$ 80% relative humidity, and especially with the semiconductor component kept over a time $t_a$ with 1 second $\leq t_a \leq$ 600 seconds at room temperature.

3. Process according to claim 1, wherein after the application of the moist material on the semiconductor component, a base medium or a medium containing basic components is applied, with a surfactant medium being used as the base medium, with water being able to be used as a surfactant medium and anionic surfactants like soap, fatty alcohol sulfates, alkyl benzolsulfonates and/or cationic surfactants like invert soap and/or amphoteric surfactants and/or non-ionic surfactants like non-carboxylic acid esters of polyalcohols, with the surfactant medium preferably being applied in the form of a liquid or a foam in the area of the applied moist material onto the semiconductor component.

4. Process according to claim 1, wherein for drying the moist material (procedural step (b)), the semiconductor component is heated to the temperature $T_1$ with 100° C. $\leq T_1 \leq$ 300° C., and especially is kept at temperature $T_1$ over time $t_1$ with 1 second $\leq T_1 \leq$ 600 seconds, and preferably at least during the maintenance over time $t_1$, preferably being exposed during the entire procedural step (b) to an oxidizing atmosphere $A_1$, preferably with a mixture of air and solvent and/or water vapor and/or reaction products of them being used as the oxidizing atmosphere $A_1$, and/or
    after procedural step (b), the semiconductor component is cooled to a temperature $R_5$ with room temperature (RT) $\leq T_5 \leq +80°$ C. as procedural step (g), with the cooling especially occurring to temperature $T_5$ in air, and/or
    after drying (procedural step (b)), and before sintering (procedural step (c)), the semiconductor component is heated to a temperature $T_6$ with 350° C. $\leq T_6 \leq$ 480° C. as procedural step (i), with the semiconductor component especially being heated to temperature $T_6$ in oxidizing atmosphere $A_2$, preferably with a mixture of air and binders, resins and/or solvents or air with an enhanced $O_2$ content ($\geq$21% by volume) being used as the oxidizing atmosphere $A_2$, and/or
    the dried material is sintered (procedural step (c)) at temperature $T_2$ with 720° C. $\leq T_2 \leq$ 920° C. and preferably the semiconductor component is kept at temperature $T_2$ during the time $t_2$ with 1 second $\leq t_2 \leq$ 120 seconds, especially with the sintering being done in air or in air with an enhanced $O_2$ content ($\geq$21% by volume).

5. Process according to claim 1, wherein the component is kept at the temperature $T_3$ (procedural step (d)) either over a time $t_3$ with 1 second $\leq t_3 \leq$ 100 seconds or over the time $t_3$ with 1 second $\leq t_3 \leq$ 24 hours in air with normal humidity or in air with reduced humidity (<20% relative humidity), and/or
    the semiconductor component is cooled to temperature $T_4$ (procedural step (e)) with $-35°$ C. $\leq T_4 \leq -200°$ C., preferably with the cooling to temperature $T_4$ occurring in an inert atmosphere or in dry air, especially the semiconductor component is kept at temperature $T_4$ over time $t_4$ with 1 second $\leq t_4 \leq$ 2 hours, especially 1 second $\leq t_4 \leq$ 4 hours, preferably with the semiconductor component being kept, and preferably cooled and kept, at the temperature $T_4$ in an inert atmosphere or in dry air, with nitrogen or argon or a mixture of $CO_2$ and these being used as the inert atmosphere, and/or
    during cooling to the temperature $T_4$, the semiconductor component is subjected to an environment in which dry ice or alcohol such as methanol or ethanol is found.

6. Process according to claim 1, wherein the semiconductor component is heated from temperature $T_4$ to room temperature (procedural step (f)) in an inert atmosphere or in dry air, especially with nitrogen or argon or $CO_2$ or a mixture of these used as the inert atmosphere, preferably with the semiconductor component being kept in an environment during heating of the semiconductor component from temperature $T_4$ to room temperature (procedural step f)), in which there is dry ice or alcohol such as methanol or ethanol.

7. Process according to claim 1, wherein in a procedural step (k), after procedural step (f), the semiconductor component is kept at room temperature over a time $t_6$ with 1 second$\leq t_6 \leq$24 hours or longer, preferably during procedural step (k) with the semiconductor component being exposed to a moist, basic or acidic atmosphere, especially during procedural step (k), subjected to an atmosphere that contains $CO_2$ and/or acetic acid.

8. Process according to claim 7, wherein after procedural step (k), at least in the area of the contacts, the semiconductor component is heated to a temperature $T_7$ with 120° C.$\leq T_7 \leq$370° C., for connecting the contacts with electrically conducting, strip-shaped connectors as procedural step (l), especially during procedural step (k) or (l) the semiconductor component being exposed to air, preferably being cooled in a procedural step (m) following procedural steps (k) or (l) to room temperature.

9. Process according to claim 1, wherein the semiconductor component is interconnected with additional semiconductor components via connectors and then, in a procedural step (n), encapsulated with additional semiconductor components, preferably with procedural step (n) or (II) carried out at a temperature $T_8$ or $T_{II}$ with 70° C.$\leq T_8, T_{II} \leq$170° C. and/or at subatmospheric pressure p with 10 Pa$\leq p \leq$1000 Pa absolute, and/or that prior to or during the encapsulation (procedural step (n) or (II)), alkaline components are added to the contacts, preferably with the alkaline components added to the contacts during procedural step (k) or (II), and especially with alkaline salts like alkali or alkaline earth carbonate being used as the alkaline components, preferably with the electrically conducting contacts being in contact with polymers containing alkaline components for addition of the alkaline components.

10. Process according to claim 1, wherein the material is sintered (procedural step (c)) so that the manufactured contacts each includes layers of varying porosity, preferably with at least the outermost layer of the sintered contact configured to have open pores, and especially at least in the outermost layer a pore volume is generated from 10% by volume to 40% by volume, especially of 25% by volume, and preferably the alkaline components are injected into the open pores and then at least segments of the contacts are covered with a metallic layer, which preferably can be galvanically applied.

11. Process according to claim 1, wherein the moist material is applied to the surface of the semiconductor component in a pasty consistency or as a paste by compressing, dispensing, ink jet application or through a wet-chemical separation process, especially that contains as the moist material a pasty, solvent-containing substance that contains metals like aluminum, silver, copper, chromium, vanadium, palladium, titanium, molybdenum as well as glasses that preferably contain metal oxides, semimetals, boron, phosphorus, as well as ceramics like $SiO_2$, boron oxide, $Al_2O_3$, $Al_xO_y$, SiC, $Si_3N_x$ as well as carbon of various morphology like soot, graphite, nanotubes, and fullerine.

12. Process according to claim 1, wherein semiconductor components are used which have a material constant K [$J/cm^{2\circ}$ C.] with 0.02$\leq$K$\leq$0.06, with $$K = A \times d \times \rho \times Cp \times B$$

where:
A=surface of the semiconductor component in $cm^2$.
d=thickness of the semiconductor component in cm.
$\rho$=density of the semiconductor component in g per $cm^3$
Cp=thermal capacity of the semiconductor component [J/gK]
B=reference size to [$1/cm^2$] of the particular semiconductor component to be treated and that, to attain a thermal content P with P=K·$\Delta$T·$\Delta$t in the individual procedural steps, the semiconductor components are exposed over a time $\Delta$t to a temperature $\Delta$T, with $\Delta$T being the temperature difference to 0° C., and/or that as interconnected semiconductor components, such are used as have a material constant K*[$J/cm2°$ C.] with 0.9$\leq$K*$\leq$1.6, where $$K^* = A^* \times d^* \times \rho^* \times Cp^* \times B^*$$

where:
A*=surface of the interconnected semiconductor component in $cm^2$.
d*=thickness of the interconnected semiconductor component in cm.
$\rho$*=density of the interconnected semiconductor component in g per $cm^3$
Cp*=thermal capacity of the interconnected semiconductor component [J/gK]
B*=reference size to [$1/cm^2$] of the interconnected semiconductor component like a solar module.
and that, to attain a thermal content P* with P*=K*·$\Delta$T·$\Delta$t in the individual procedural steps, the semiconductor components are exposed over a time $\Delta$t to a temperature $\Delta$T, with $\Delta$T being the temperature difference to 0° C.

13. Process according at least to claim 12, wherein:
for procedural step (a) the semiconductor component experiences a thermal content P with 0.4 J s/$cm^2 \leq$P$\leq$720 J s/$cm^2$ and/or
for procedural step (b) the semiconductor component experiences a thermal content P with 2 J s/$cm^2 \leq$P$\leq$10800 J s/$cm^2$ and/or
for procedural step (c) the semiconductor component experiences a thermal content P with 288 J s/$cm^2 \leq$P$\leq$4416 J s/$cm^2$ and/or
for procedural step (d) the semiconductor component experiences a thermal content P with 0.4 J s/$cm^2 \leq$P$\leq$1440 J s/$cm^2$ and/or
for procedural step (e) the semiconductor component experiences a thermal content P with −1.2 J s/$cm^2 \leq$P$\leq$86400 J s/$cm^2$ and/or
for procedural step (i) the semiconductor component experiences a thermal content P with 7 J s/$cm^2 \leq$P$\leq$3456 J s/$cm^2$ and/or
for procedural step (l) the semiconductor component experiences a thermal content P with 0.24 J s/$cm^2 \leq$P$\leq$333 J s/$cm^2$ and/or
for procedural step (m) the semiconductor component experiences a thermal content P with 117000 J s/$cm^2 \leq$P$\leq$460800 J s/$cm^2$ and/or
for procedural step (n) the semiconductor component experiences a thermal content P with 117000 J s/$cm^2 \leq$P$\leq$460800 J s/$cm^2$ and/or
for procedural step (I) the composite of the semiconductor components experiences a thermal content P with 0.24 J s/$cm^2 \leq$P*$\leq$333 J s/$cm^2$ and/or
for procedural step (II) the composite of the semiconductor components experiences a thermal content P with 117000 J s/$cm^2 \leq$P*$\leq$460800 J s/$cm^2$ and/or
for procedural step (III the composite of the semiconductor components experiences a thermal content P with 10 J s/$cm^2 \leq$P*$\leq$81000 J s/$cm^2$ and/or
for procedural step (IV) the composite of the semiconductor components experiences a thermal content P with −20 J s/$cm^2 \leq$P*$\leq$18000 J s/$cm^2$.

* * * * *